(12) United States Patent
Brown et al.

(10) Patent No.: US 6,227,630 B1
(45) Date of Patent: May 8, 2001

(54) ACCESSORY MOUNTING FOR DIGITAL COMPUTER

(75) Inventors: Fraser Brown, Ayr; Ian McFarlane Denny, Greenock; Peter Andrew Smith, Skelmorlie; Gavin Wright, Inverclyde, all of (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/245,805

(22) Filed: Feb. 5, 1999

(30) Foreign Application Priority Data

Apr. 8, 1998 (GB) .................................................. 9807424

(51) Int. Cl.[7] .................................................. A47B 97/00
(52) U.S. Cl. ..................... 312/223.2; 312/319.1
(58) Field of Search ............... 312/223.1, 223.2, 312/330.1, 333, 332.1, 319.1, 319.2; 361/725, 727, 683, 684, 685

(56) References Cited

U.S. PATENT DOCUMENTS

| 5,332,306 | | 7/1994 | Babb et al. ...................... 312/334.16 |
| 5,340,340 | * | 8/1994 | Hastings et al. .................. 361/727 X |
| 5,549,375 | * | 8/1996 | Pagliaccio ............................ 312/319.1 |
| 5,563,767 | * | 10/1996 | Chen ..................................... 361/685 |
| 5,586,003 | * | 12/1996 | Schmitt et al. ................... 361/684 X |
| 5,588,728 | * | 12/1996 | Eldridge et al. .............. 312/223.1 X |
| 5,765,933 | * | 6/1998 | Paul et al. .......................... 312/332.1 |
| 5,797,667 | * | 8/1998 | Wu ..................................... 312/332.1 |
| 5,975,735 | * | 11/1999 | Schmitt ............................ 361/685 X |

* cited by examiner

Primary Examiner—James O. Hansen
(74) Attorney, Agent, or Firm—Robert B. Martin (57) ABSTRACT

A mounting for a computer accessory such as a hard disc drive comprises a tray (2) for accommodating the accessory (1) which can be inserted into a mounting bay in the computer against the bias of a pair of springs (4). The tray (2) carries a bezel member (7) movable along the insertion path independently of the tray to latch or unlatch the tray in place, using latching members (6) in association with latching tracks formed in the bezel, by way of a push-push action.

1 Claim, 8 Drawing Sheets

ACCESSORY MOUNTING FOR DIGITAL COMPUTER

FIELD OF THE INVENTION

This invention relates generally to digital computers and particularly to the mounting of accessories in such computers and like systems.

BACKGROUND OF THE INVENTION

Conventionally digital computers and particularly the class of digital computers referred to as personal computers (PC's) are supplied with mounting bays to accommodate accessories such as disc storage devices which may be added after initial installation of the computer. Typically the accessory is electrically connected to the system by a multi-way electrical connector and the mounting bay includes securing brackets to hold the accessory in place using nuts and bolts or other fasteners. Typically the mounting bay is located at the front of the machine and a bezel is provided to cover the front of the accessory to enhance the appearance of the installation and where required to provide access for discs or other media.

Such accessories when installed have normally become virtually permanent features of the computer, with very little need for subsequent removal. However for certain applications it is desirable that the accessory be readily removable and replaceable, for example where it is required to transport a hard disc drive to another installation or to remove it for security reasons. Existing accessory mountings are not well suited to such applications and it is an object of the present invention to provide a mounting which permits easy removal and replacement.

SUMMARY OF THE INVENTION

According to the invention there is provided an accessory mounting for a digital computer or the like comprising an accessory tray for accommodating an accessory and adapted for insertion into a mounting bay of said computer along an insertion path against resilient means arranged to bias said tray out of said mounting bay when fully inserted and latching means adapted to hold said tray in said mounting bay against the bias of said resilient means and operable to release said accessory for ejection from said mounting bay by said bias.

In embodiments of the invention described below a bezel member is mounted on the tray for movement relative thereto in the direction of the insertion path and the latching means includes a track member carried by the bezel member and adapted to co-operate with a follower to cause the tray to be latched in a fully inserted position or to be released from such position in response to movement of the bezel member relative to the tray in the direction of insertion. Bias means are provided to bias the bezel member away from the tray with a force weaker than that exerted by the resilient means, whereby pressure applied to the bezel member causes movement thereof relative to the tray to effect latching of the tray when unlatched and release of the tray when latched.

In a first embodiment of the invention the tray carries a rear mounted ejection spring which provides the outward bias by bearing against the rear of the mounting bay when the accessory is pushed into place. The bezel member includes a pair of tracks substantially cardioid in shape, one moulded in each side thereof. The bottom of the track is stepped to ensure that a follower pin mounted on a flexible arm secured to the mounting bay proceeds around the track in one direction only.

In a second embodiment of the invention the tray is arranged to engage springs mounted on the rear of the mounting bay and the bezel is movable relative to the tray to cause a pair of latches one on each side of the tray to be lowered and raised, co-operating with pins secured to the accessory housing respectively to retain and release the accessory. In this embodiment a track element located centrally of the bezel provides the raising and lowering movement of the latches by cam action on a follower mounted on an axle which carries the latches.

BRIEF DESCRIPTION OF THE DRAWINGS

In order that the invention may be well understood the embodiments referred to above will now be described with reference to the accompanying drawings in which.

DETAILED DESCRIPTION OF THE PREFERRED EMBODIMENTS

Figure 1:
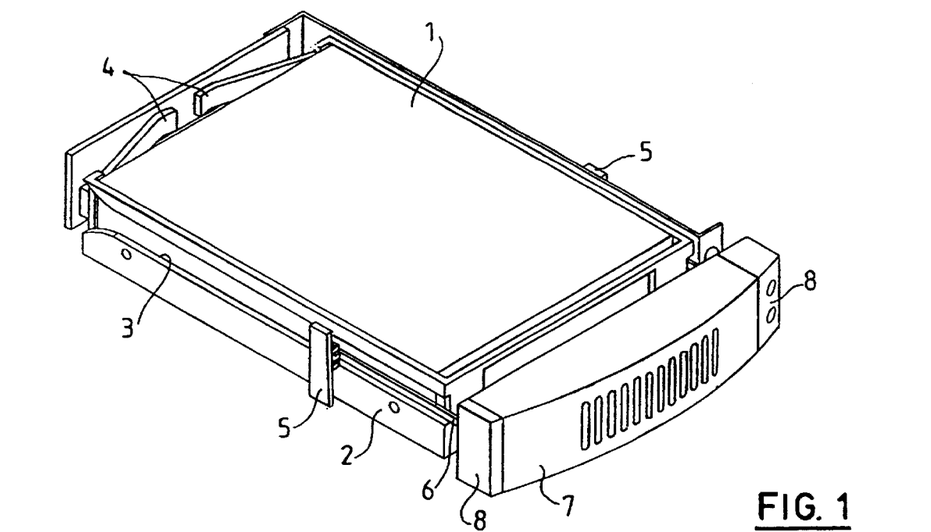
FIG. 1 is a perspective view of the first embodiment showing the mounting in position in the computer.

Referring to FIG. 1 there is shown a mounting for a hard disc file 1 comprising a tray 2 provided with guide grooves 3 on either side which co-operate with guide rails (not shown) in the computer's accessory housing to guide the tray into position. A pair of springs 4 are provided to bias the tray outwardly of the housing when pushed fully home. At either side of the housing and secured thereto is a latch bar support 5 each supporting a latch bar 6 which extends forward through the corresponding groove 3 and carries at its end a follower pin (not shown). A separate bezel 7 has end pieces 8 which are mounted to retain the corresponding latch bar and follower pin in a latching track formed in the side of the bezel 7 as will be described with reference to FIG. 2.

Figures 2, 2A:
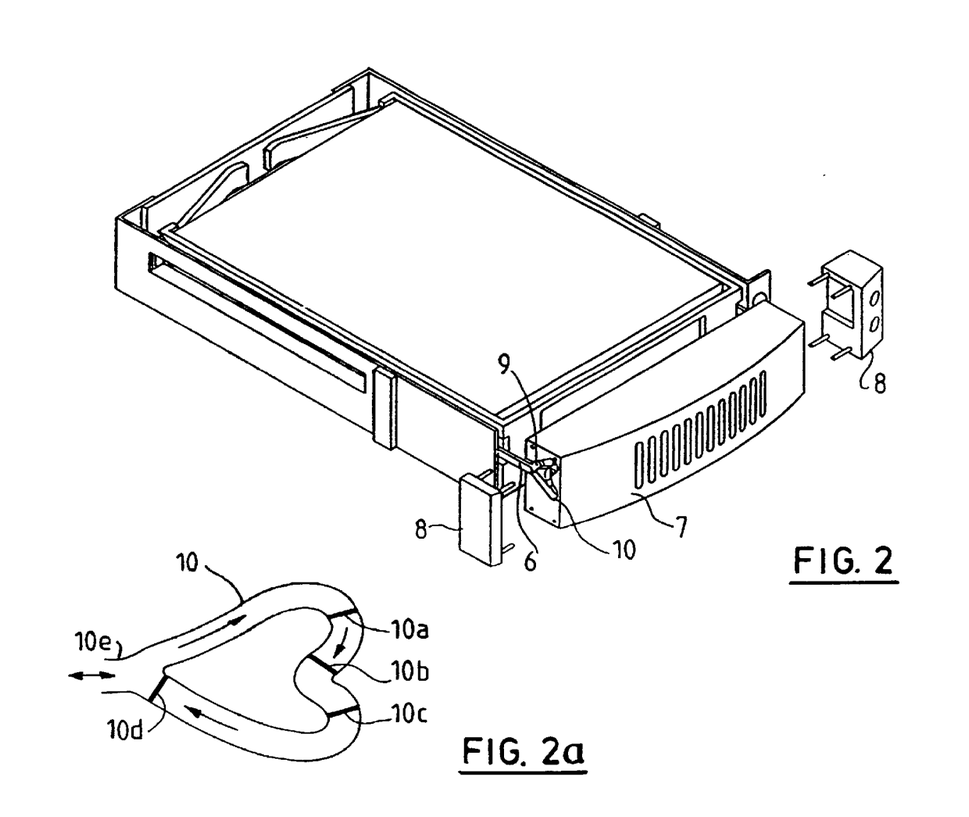
FIG. 2 shows the latching tracks on either side of the bezel in the embodiment of FIG. 1.
FIG. 2a is a view of the end of a latching track.

FIG. 2 shows the bezel 7 with the end pieces 8 displaced to show the manner in which the latching bar 6 and its associated follower pin 9 engage a substantially cardioid-shaped latching track 10. As shown in FIG. 2a the track 10 is stepped at 10a, 10b, 10c and 10d and provided with inclined sections between the steps to permit the pin 9 to travel therearound in one direction only, and is provided with a port 10e at the cusp of the cardioid to permit entry and exit of the follower pin 9.

Figure 3:
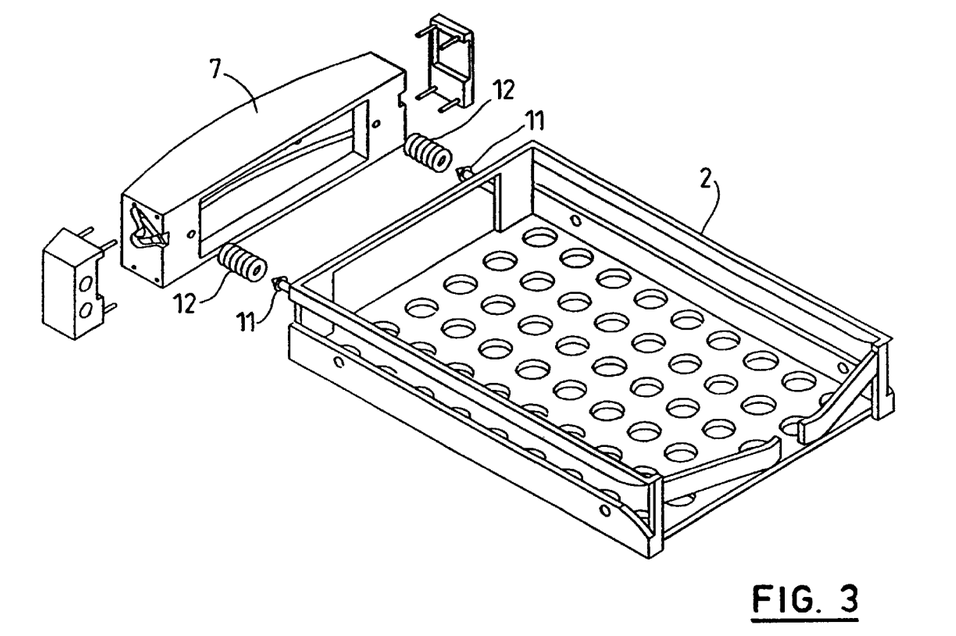
FIG. 3 is an exploded view of the tray and its associated bezel.
Figure 4:
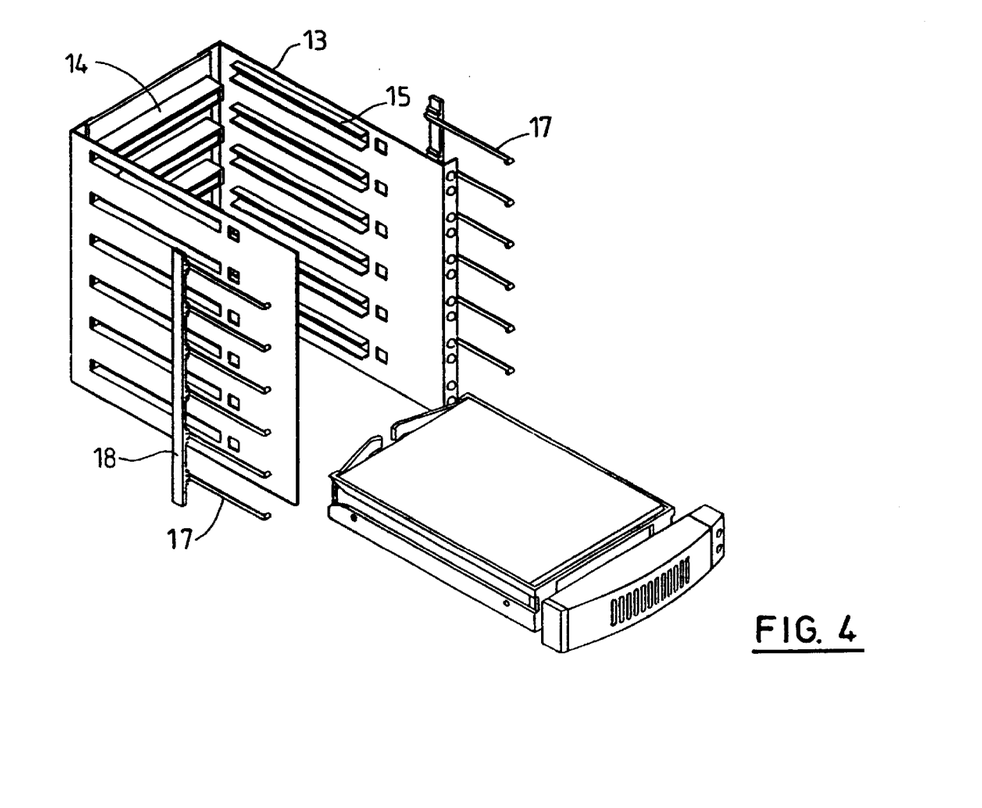
FIG. 4 shows a typical installation in a multi-accessory environment.

FIG. 3 shows the manner in which the bezel 7 is mounted on the tray 2. Each of a pair of support pins 11 is snapped through a matching hole in the bezel 7 and co-operates with an associated compression spring 12 to bias the bezel away from the tray 2. A typical installation is shown in FIG. 4 and takes the form of a housing cage 13 adapted to accommodate up to six accessories providing, for each accessory, a connector 14, guide rails 15, latching bars 17 and associated latching bar supports 18.

In operation, when a tray 2 carrying an accessory is inserted into the computer housing 13 the guide grooves 3 in the tray engage the corresponding guide rails 15 and the tray is pushed into place by applying force to the front bezel. This compresses the springs 12 which normally keep the bezel and tray apart until the bezel contacts the tray. The force applied to the bezel is then transmitted to the tray, which moves into the housing towards the corresponding connector 14 and the associated springs 4 start to compress.

Shortly before the tray is fully home the tracking pins 9 enter the latching tracks 10 in the bezel. Each pin follows the cardioid shape of the associated track, the base of which, as already described, is stepped to prevent return of the pin to its entry point. The latching bars 17 are designed to flex in a horizontal direction as their associated tracking pins ride up the inclined sections of the tracks and over the steps 10a –d, the restoring force under flexure retaining the pin in the track. The pin drops over the step 10a in the track and, on release of the bezel, enters the cleft of the cardioid over step 10b thereby locking the tray in the inserted position.

In order to remove the drive the bezel is depressed again. This drives the pin into the other half of the cardioid where it drops over a step 10c preventing its return to the locked position. At this point no further compression of the springs 12 can take place. The operator can then release all pressure on the bezel which permits the tray to eject itself partially from the housing under the effect of the compressed springs 4. The bezel returns to its free position and the tracking pins 9 leave the tracks 10. The tray can then be fully withdrawn from the housing.

The second embodiment of the invention is shown in FIGS. 5–13.

Figure 5:
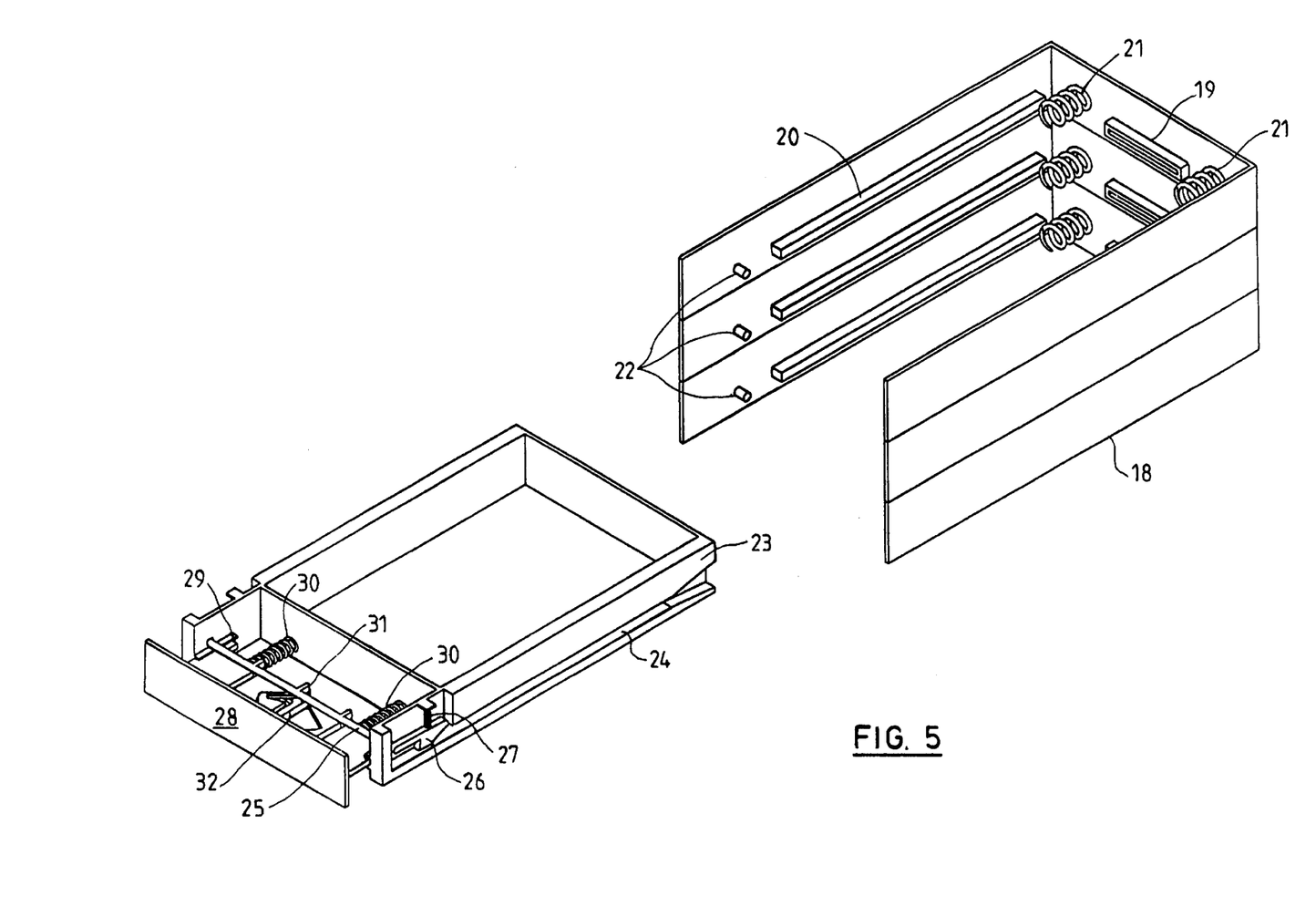
FIG. 5 is a general view of the second embodiment of the invention together with the associated accessory cage.

Referring first to FIG. 5 a computer housing 18 providing accommodation for up to three accessories is shown. Connectors 19 are provided as before together with guide rails 20. However in this embodiment the housing itself provides the resilient bias for an accessory tray accommodated in the housing by means of springs 21 mounted on the rear of the housing on either side of the connector 19. The housing also includes latching pegs 22 which as will be described below are arranged to hold an accessory tray in place when the latter is pushed fully home.

The accessory tray 23 is provided as in the previously described embodiment with grooves 24 to define a path along which the tray moves when pushed into the housing. Also mounted in the tray is a latch axle 25 carrying at each end a latching hook 26 which is biased downwards towards the base of the groove 24 by a compression spring 27. A bezel member 28 is mounted on the tray in a pair of slides 29 so that it can move relative to the tray, in the direction of insertion, against the force of a pair of compression springs 30 which bias the bezel normally outwards with a force less than that exerted by the compression springs 21 in the housing when the tray is pushed home. The latching axle 25 carries a follower 31 which co-operates with a track member 32 which is pivotally mounted in the base of the bezel to lift or lower the follower as the bezel is moved relative to the tray as will be described in detail later.

Figure 6:
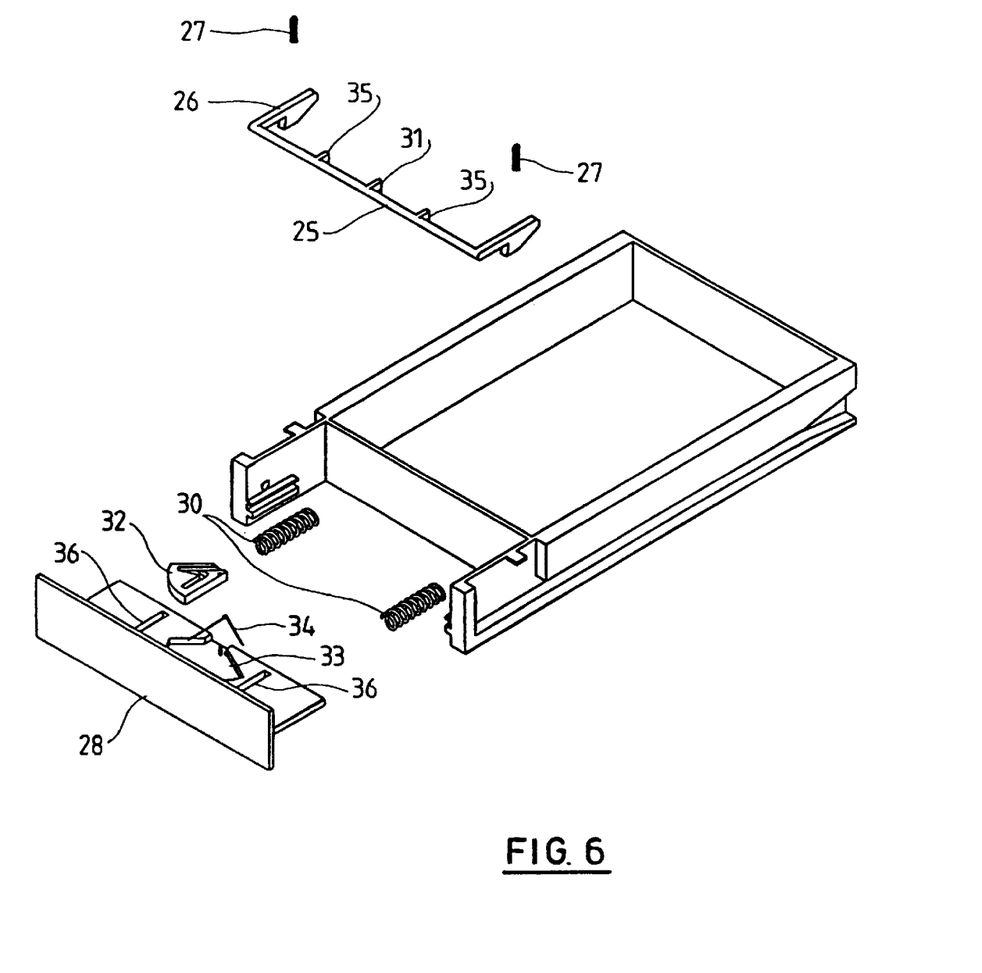
FIG. 6 is an exploded view of the embodiment of FIG. 5.

The various components of the embodiment are shown in the exploded view in FIG. 6 from which it will be seen that the track member 32 is mounted for limited rotary movement in a recess 33 in the base of the bezel member 28 against the bias of a torsion spring 34 which normally holds the track member 32 in a clockwise position. The latch axle 25 is seen to carry in addition to the latching hooks 26 and the follower 31 a pair of restraining pins 35 which engage in slots 36 provided in the base of the bezel member 28 to limit movement of the bezel relative to the tray.

Figure 7A:
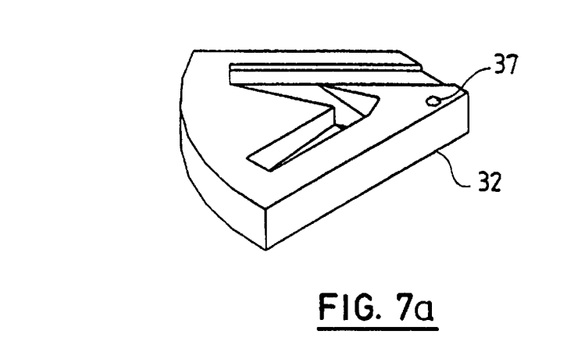
FIGS. 7a–7e show parts of the mechanism of the embodiment of FIG. 5 in greater detail.
Figure 7B:
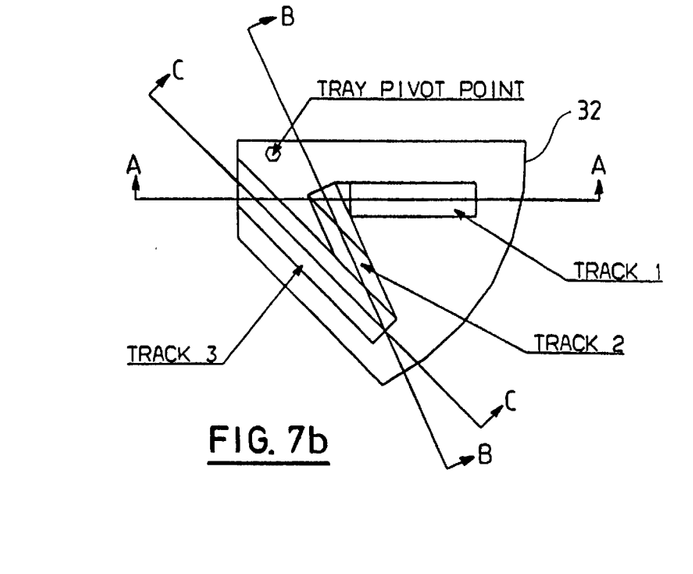
Figure 7C:
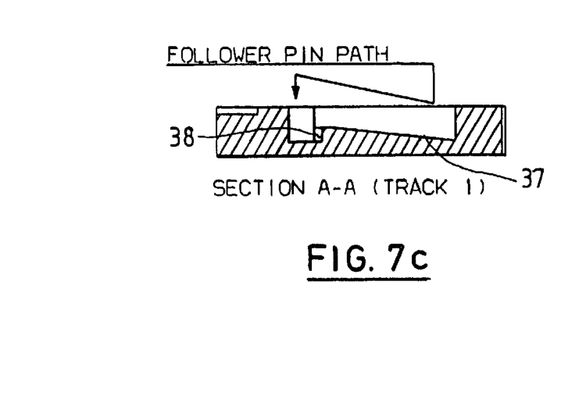
Figure 7D:
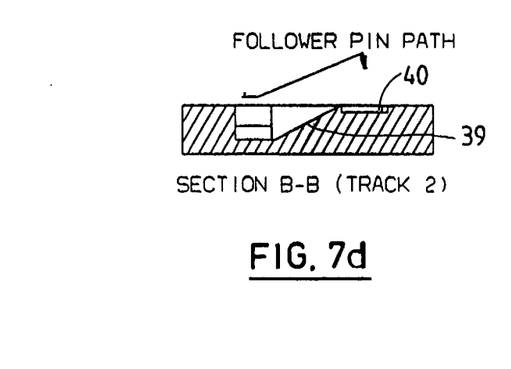
Figure 7E:
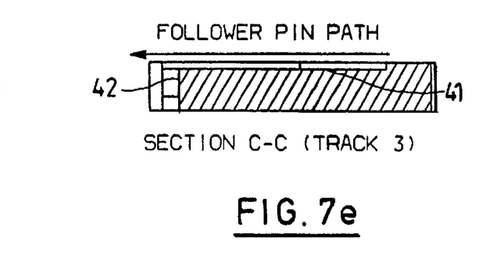

FIGS. 7a–7e show the configuration of the track member 32. As will be seen from FIG. 7a the member 32 is mounted in the bezel recess 33 about a pivot point 37 and presents to the A follower pin 31 a series of three linear tracks, tracks 1, 2 and 3, each having an inclined floor, as shown in greater detail in FIGS. 7b–7e. FIG. 7b shows the three tracks in plan form, indicating sections taken along the three tracks in FIGS. 7 c, d and e respectively. Thus track 1 (FIG. 7c) presents to the follower 31 an incline 37 followed by a step 38 which prevents return of the follower in the reverse direction. Track 2 (FIG. 7d) presents a second incline 39 from the step 38 to a plateau position 40 whilst track 3 presents a level transition 41 to a step 42 from which the follower 31 can exit on withdrawal of the tray from the housing.

Figure 8:
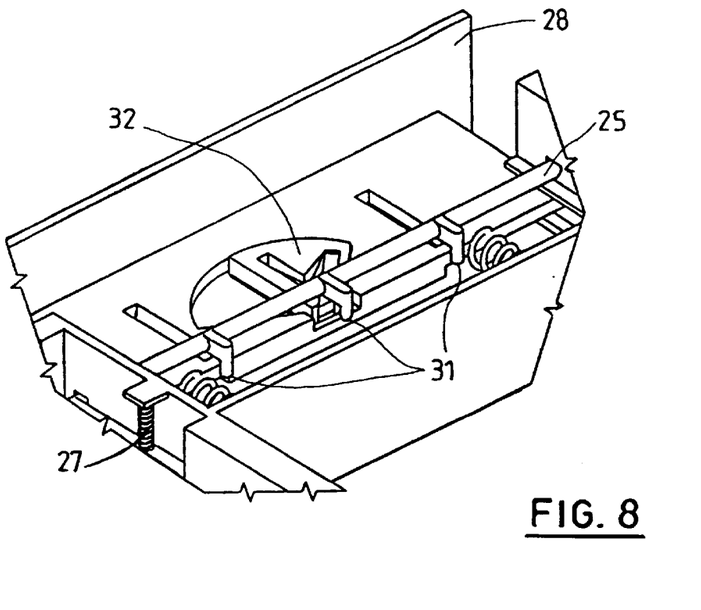
FIGS. 8–14 show the mechanism of the embodiment of FIG. 5 at various stages in its operation.
Figure 9:
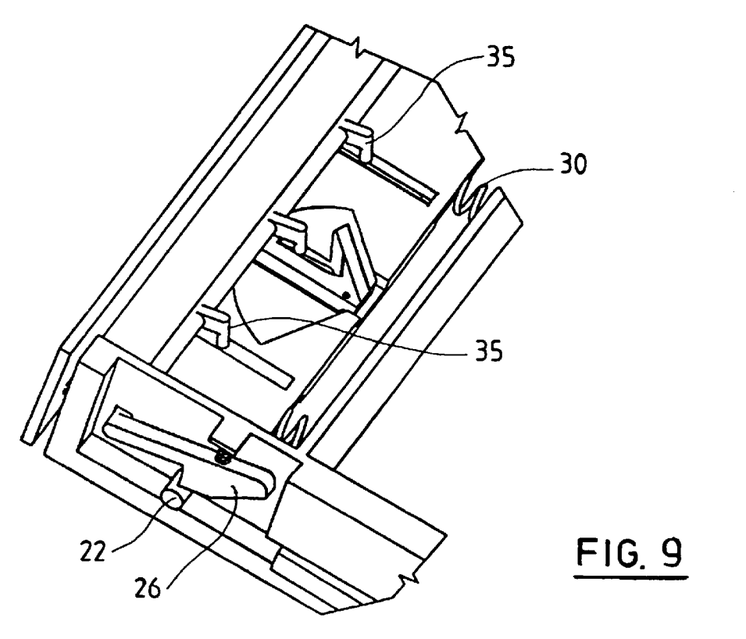

The operation of inserting the tray and bezel will now be described with reference to FIGS. 8–13. FIG. 8 shows part of the tray/bezel assembly prior to entry into the computer housing. The latch axle 25 is biased downwards by the springs 27 and the pins 35 engage the edge of the bezel member 28 to prevent relative movement between the bezel member and the tray. The track member 32 is biased by the torsion spring 34 into its clockwise position. As the tray is inserted into the housing it is guided towards the back of the housing along the rails 20 until the pegs 22 engage the respective latching hooks 26. As shown in FIG. 9 the latching axle is then rotated by camming action of the pegs 22 on the latching hooks 26 permitting the pins 35 to lift clear of the base of the bezel.

Figure 10:
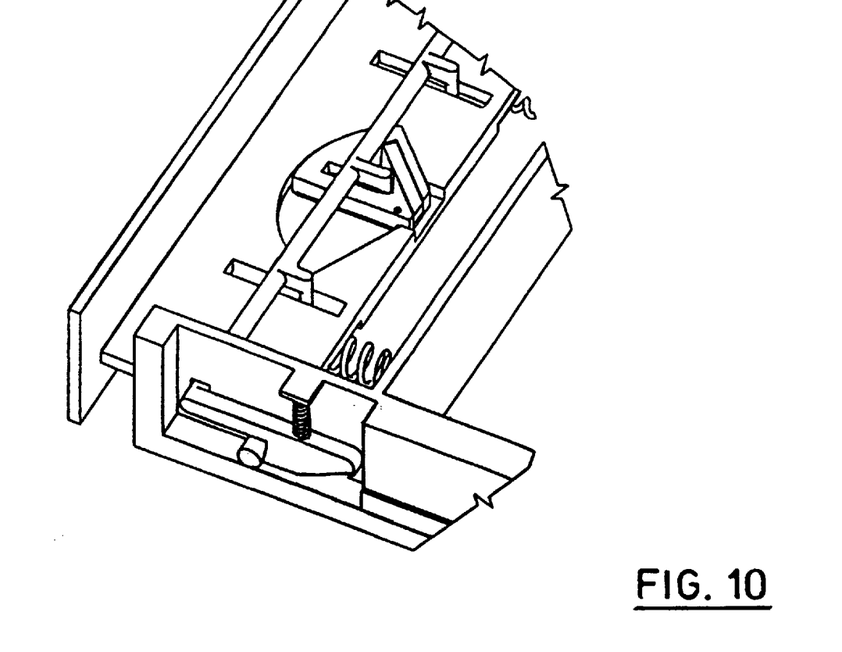
Figure 11:
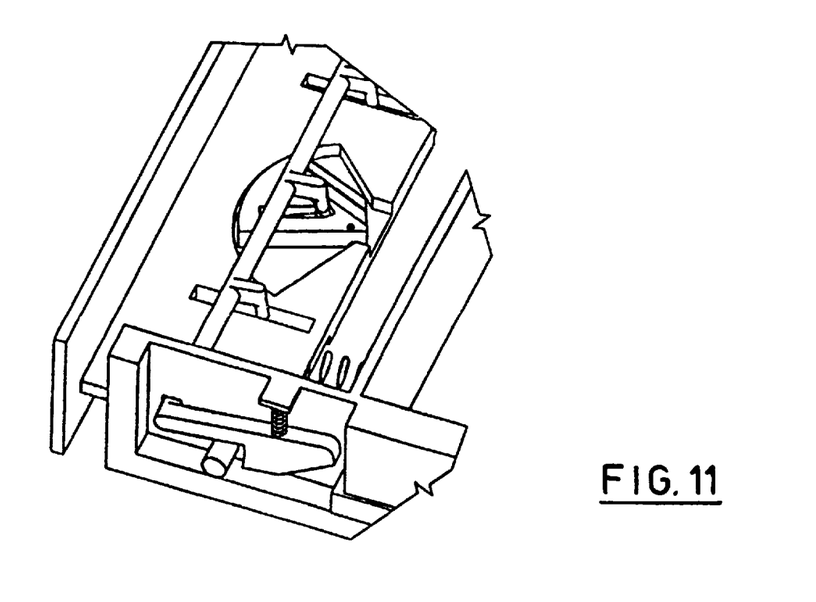

Continuing insertion force to the front of the bezel compresses the springs 30 completely and the tray continues to be moved against the compression springs 21 to permit the latch hooks 26 to drop over the pins 22 under the influence of the springs 27. This allows the latching axle 25 to return to its rest position and the follower 31 to drop into track 1 of the track member 32, as shown in FIG. 10.

When the insertion force is removed, the tray is retained in the housing by the latch hooks 26 and the pegs 22, and the bezel member 28 returns to its rest position under the influence of the springs 30. The follower 31 drops over the step 38 at the end of track 1. The accessory is now fully latched in position.

Figure 12:
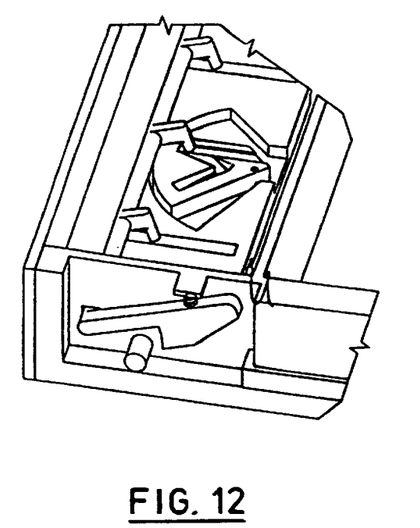
Figure 13:
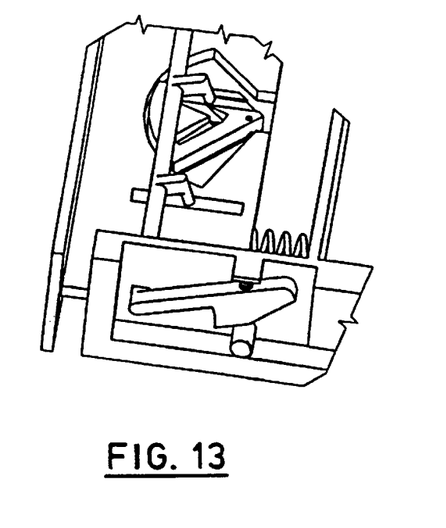
Figure 14:
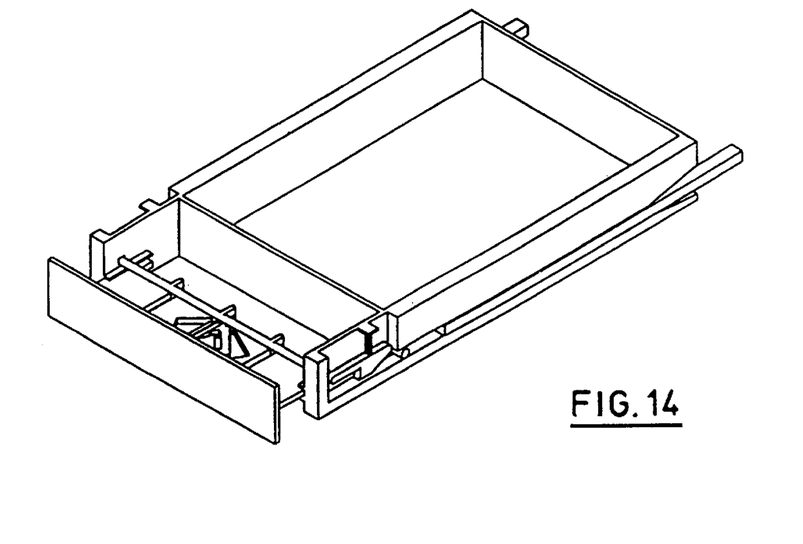

In order to remove the accessory the bezel is pushed inwards. As shown in FIG. 12 this causes the follower 31 to be driven upwards by the incline in track 2 of the track member 32, deflecting the latter against the torsion spring 34 and rotating the latching axle 25 to cause the latching hooks 27 to disengage from the pegs 22. When the follower 31 reaches the end of track 2 it drops over the recess 40 into the third track 3 so that when the force is removed from the bezel the springs 31 are permitted to eject the tray from the housing FIG. 13. At this point the bezel member 28 moves back to its initial position and the follower 31 runs along track 3 and out of the track member thus returning to its initial starting position. The accessory can then be fully removed from the housing (FIG. 14.)

It will be appreciated that various refinements may be made to the embodiments described to improve the performance in particular applications. For example it may be desirable to ensure that the ejection force applied by the springs at the rear of the housing, whether they be built into the tray or the housing be limited to avoid full ejection of the accessory resulting possibly in damage thereto. This could be achieved for example by fitting a rotary damper to the ejection mechanism.

What is claimed is:

1. An accessory mounting for a digital computer having a mounting bay comprising:

(a) an accessory tray insertable into the mounting bay and having an opening for receiving an accessory;

(b) a resilient means positioned between the mounting bay and the accessory tray to bias the accessory tray out of the mounting bay when fully inserted;

(c) a latching means attached to the tray to hold the accessory tray in the mounting bay against the bias of the resilient means and operable to release the accessory tray from the mounting bay, the latching means including a pair of track follower pins;

(d) a bezel member mounted on the tray for movement relative thereto and having a pair of substantially cardioid shaped track members, one on each side thereof, each adapted to cooperate with one of the follower pins to cause the tray to be latched in a fully inserted position or to be released from that position in response to movement of the bezel member relative to the tray, the track members being stepped to permit the associated follower pin to proceed therearound in one direction only from an entry point at the cusp of the cardioid to a latching position at the cleft thereof, and thereafter to permit exit of the follower pin from the track at the entry point; and (e) a bias means adapted to bias the bezel member away from the tray with a force weaker than that exerted by the resilient means; whereby pressure applied to the bezel member causes movement thereof relative to the tray to effect latching of the tray when it is unlatched and release of the tray when it is latched.

* * * * *